United States Patent
Elkind et al.

(10) Patent No.: US 11,923,815 B2
(45) Date of Patent: Mar. 5, 2024

(54) ELECTRONIC INTEGRATION CIRCUIT HAVING OFFSET AND COLLECTED CHARGE REDUCTION CIRCUITRIES AND ASSOCIATED METHODS

(71) Applicant: TriEye Ltd., Tel Aviv (IL)

(72) Inventors: Shimon Elkind, Tel Aviv (IL); Nadav Melamud, Tel Aviv (IL)

(73) Assignee: TriEye Ltd., Tel Aviv (IL)

( * ) Notice: Subject to any disclaimer, the term of this patent is extended or adjusted under 35 U.S.C. 154(b) by 0 days.

(21) Appl. No.: 18/254,607

(22) PCT Filed: Jun. 5, 2022

(86) PCT No.: PCT/IB2022/055221
§ 371 (c)(1),
(2) Date: May 26, 2023

(87) PCT Pub. No.: WO2022/259114
PCT Pub. Date: Dec. 15, 2022

(65) Prior Publication Data
US 2023/0396223 A1 Dec. 7, 2023

Related U.S. Application Data

(60) Provisional application No. 63/197,429, filed on Jun. 6, 2021, provisional application No. 63/197,430, filed on Jun. 6, 2021.

(51) Int. Cl.
*H03F 3/45* (2006.01)

(52) U.S. Cl.
CPC ... *H03F 3/45475* (2013.01); *H03F 2200/375* (2013.01)

(58) Field of Classification Search
CPC .......................................................... H03F 3/45
USPC ..................................................... 330/9, 260
See application file for complete search history.

(56) References Cited

U.S. PATENT DOCUMENTS

| | | | | |
|---|---|---|---|---|
| 5,391,999 A * | 2/1995 | Early | ................... | H03H 19/004 327/554 |
| 5,867,012 A * | 2/1999 | Tuthill | ...................... | G05F 3/30 323/316 |
| 7,679,422 B1 * | 3/2010 | Thiagarajan | ............. | G06G 7/18 327/337 |

(Continued)

OTHER PUBLICATIONS

International Search Report and Written Opinion in related PCT application PCT/IB2022/055221, dated Sep. 21, 2022.

*Primary Examiner* — Henry Choe
(74) *Attorney, Agent, or Firm* — Nathan & Associates; Menachem Nathan

(57) ABSTRACT

An integrator having an offset evaluation circuit and a collected charge reduction circuitry and method for using the integrator. The integrator includes an amplifier, operable to amplify an input signal, an integration capacitor for collecting charge indicative of a level of the input signal and an offset capacitor. The offset evaluation circuit is operable to charge the offset capacitor with charge corresponding to an offset voltage of the amplifier and the collected charge reduction circuitry is operable to collect charge resulting from disconnection of the offset evaluation circuit, thereby reducing an amount of charge and associated noise input to the amplifier.

19 Claims, 5 Drawing Sheets

(56) References Cited

U.S. PATENT DOCUMENTS

| | | | |
|---|---|---|---|
| 8,599,053 B2* | 12/2013 | Quiquempoix | H03F 3/005 |
| | | | 341/143 |
| 8,970,300 B2* | 3/2015 | Piepenstock | H03F 3/45497 |
| | | | 330/307 |
| 2005/0231411 A1 | 10/2005 | Wu et al. | |
| 2012/0133800 A1 | 5/2012 | Jung et al. | |
| 2013/0127516 A1 | 5/2013 | Lee | |
| 2013/0147496 A1 | 6/2013 | Moedl et al. | |
| 2016/0013765 A1 | 1/2016 | Peluso | |

\* cited by examiner

US 11,923,815 B2

ELECTRONIC INTEGRATION CIRCUIT HAVING OFFSET AND COLLECTED CHARGE REDUCTION CIRCUITRIES AND ASSOCIATED METHODS

CROSS REFERENCE TO RELATED APPLICATIONS

This is a 371 application from international patent application PCT/IB2022/055221 filed Jun. 5, 2022, which claims priority from U.S. provisional patent applications No. 63/197,429 filed Jun. 6, 2021 and 63/197,430 filed Jun. 6, 2021, both of which are incorporated herein by reference in their entirety.

FIELD

This disclosure relates generally to an electronic integrator, and more specifically to an electronic integrator having an offset reduction and collected charge reduction circuitries, and associated methods.

BACKGROUND

A large number of electronic applications, specifically measurements, involve using an amplifier to increase the amplitude of a signal applied to its input terminals, producing a proportionally greater amplitude signal at its output. For example, a trans-impedance amplifier may be used to amplify a current input into a voltage output. Amplifiers and integration circuits comprising amplifiers may have some drawbacks or challenges that relate to the specific application and its required specifications. An offset voltage appears at the output of the amplifier, contributing to the overall system error. In some applications, the offset voltage may cause additional complications and challenges. For example, in a photodiode amplifier, the amplifier may generate additional error as the offset voltage appearing across the photodiode causes increased dark current. The dark current may further increase the system offset error. Therefore, reduction of the effects of the offset voltage may significantly improve the outputs of circuits comprising the amplifier.

Traditional offset cancelation solutions suffer from complications. For example, common offset cancelation solutions may include large capacitors, however such offset cancelation solutions may not be feasible in applications that require a limited size. Other offset cancelation solutions may introduce additional noise, crosstalk or other unbalanced conditions to the circuits. Therefore improved offset reduction and correction circuitries are highly required.

SUMMARY

In various embodiments there are provided integrators, comprising: an amplifier operable to amplify an input signal; an integration capacitor for collecting charge indicative of a level of the input signal; an offset capacitor; an offset evaluation circuit operable to charge the offset capacitor with charge corresponding to an offset voltage of the amplifier; and a collected charge reduction circuitry operable to collect charge resulting from disconnection of the offset evaluation circuit.

In various embodiments there are provided methods, comprising: connecting an offset evaluation circuit to charge an offset capacitor with a first charge corresponding to an offset voltage of an amplifier; connecting a collected charge reduction circuitry between an output of the amplifier and a first input of the amplifier; disconnecting the offset evaluation circuit; by the collected charge reduction circuitry, collecting a second charge resulting from disconnection of the offset evaluation circuit; and by an integration capacitor, collecting a third charge indicative of a level of an input signal to the amplifier, thereby reducing an amount of charge and associated noise input to the amplifier.

In some embodiments, the input signal is provided by a source comprising at least one photodiode, operable to generate electric charge in response to light impinging on the at least one photodiode.

In some embodiments, the input signal is coupled to a first input of the amplifier, and wherein a reference signal is provided to a second input of the amplifier.

In some embodiments, the offset capacitor is coupled between the first input and a reference voltage source.

In some embodiments, the integration capacitor is coupled between an output of the amplifier and via the offset capacitor to the first input of the amplifier.

In some embodiments, the offset evaluation circuit is coupled between the output of the amplifier and the first input of the amplifier and is operable to selectively couple a first terminal of the offset capacitor to the output of the amplifier while a second terminal of the offset capacitor is coupled to the reference voltage source.

In some embodiments, the collected charge reduction circuitry is coupled between the output of the amplifier and a first input of the amplifier.

In some embodiments, the collected charge reduction circuitry comprises at least one capacitor.

In some embodiments, the collected charge reduction circuitry is connected to the integrator via a switch.

In some embodiments, the integration capacitor is connected between the switch and the first input of the amplifier and wherein the offset capacitor is connected between the switch and a dedicated reference signal.

BRIEF DESCRIPTION OF THE DRAWINGS

Non-limiting examples of the presently disclosed subject matter are described below with reference to figures attached hereto, which are listed following this paragraph. Identical structures, elements or parts that appear in more than one figure may be labeled with the same numeral in the figures in which they appear. The drawings and descriptions are meant to illuminate and clarify embodiments disclosed herein, and should not be considered limiting in any way.

Figure 1:
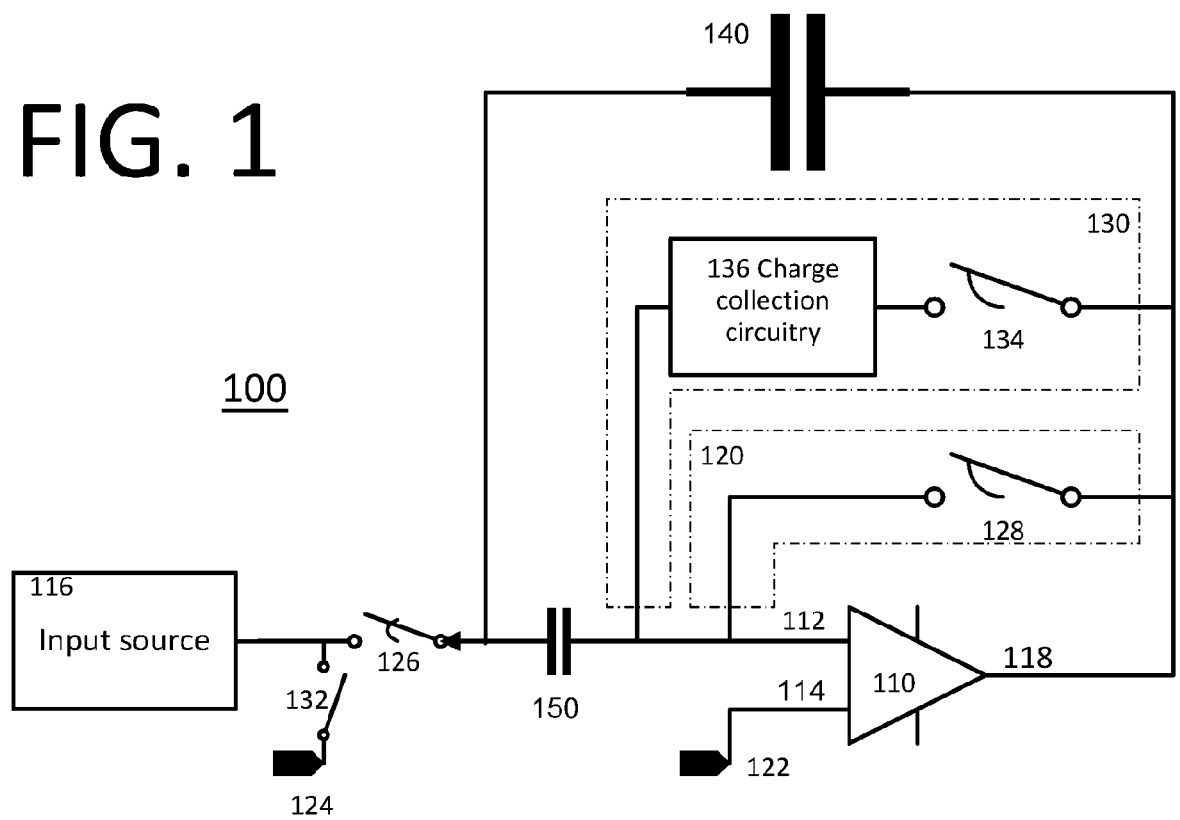
FIG. 1 is a schematic block diagram illustrating an exemplary integrator having offset reduction and collected charge reduction circuitries disclosed herein.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth to provide a thorough understanding of the disclosure. However, it will be understood by those skilled in the art that the present disclosure may be practiced without these specific details. In other instances, well-known methods, procedures, and components have not been described in detail so as not to obscure the present disclosure.

FIG. 1 is a schematic block diagram illustrating an exemplary embodiment 100 of an integrator (or "regulated integrator") having offset reduction and collected charge reduction circuitries, in accordance with some embodiments disclosed herein. Integrator 100 may include an amplifier 110, an offset evaluation circuit or circuitry 120 and a collected charge reduction circuit or circuitry 130, also referred to herein as "noise reduction circuit". Electronic integration circuit 100 may also include a first capacitor 140, also referred to herein as "integration capacitor" or "feedback capacitor", and a second capacitor 150 also referred to herein as "offset capacitor" 150.

Amplifier 110 may include a first input 112, also referred to herein as "inverting input" of amplifier 110, and a second input 114 also referred to herein as "non-inverting input" of amplifier 110. Amplifier 110 may be operable or used to amplify an input signal, e.g., arriving from a signal input source 116 connected to first input 112 and output the amplified signal via an output 118 of amplifier 110.

A first reference signal (and associate reference source) 122 may be provided to second input 114 of the amplifier. The reference signal may be for example a reference voltage, e.g., a constant reference voltage, a reference current, e.g., a constant reference current, or any other suitable reference signal. According to some embodiments, first reference signal 122 may be applied to second input 114 to achieve zero bias conditions and/or to reach a desired signal level on first input 112 and/or on output 118. It should be understood to a person skilled in the art that any suitable reference signal may be selected and/or provided as first reference signal 122.

Examples for reference signals and for circuits which can generate them are disclosed in detail in co-owned international patent application PCT/IB2020/010011. Any relevant circuit disclosed in the aforementioned PCT application may be used for generating reference signals to the presently disclosed integrators, mutatis mutandis.

Capacitor 150 may be connected between first input 112 of amplifier 110 and a second reference signal (and associated reference source) 124 via a switch 126. Second reference signal 124 may be connected and/or disconnected to input source 116 by a switch 132 and may include any reference signal for example a reference voltage, e.g., a constant reference voltage, a reference current, e.g., a constant reference current, or any other suitable reference signal. Offset capacitor 150 is coupled between input 112 and reference voltage source 124 and may be charged corresponding to an offset voltage of amplifier 110 as described in various embodiments.

According to some embodiments, second reference signal 124 may be selected such as to reach a desired signal level on first input 112 and/or on output 118. For example, second reference signal 124 may be equal to the input voltage of integrator 100. It should be understood to a person skilled in the art that any suitable reference signal may be selected and/or provided as second reference signal 124. In some embodiments, first reference signal 122 and second reference signal 124 are selected such as to achieve a desired signal level on first input 112 and/or on output 118 of amplifier 110.

Integration capacitor 140 may be connected or coupled between output 118 of amplifier 110 and first input 112, via offset capacitor 150. Capacitor 140 may collect charge that may be indicative of a level, strength or power of input signal 116. For example, the amount of charge collected by capacitor 140 may be parallel, corresponding or related to input signal 116. While offset capacitor 150 may be charged corresponding to an offset voltage of amplifier 110, integration capacitor 140 may be charged with a charge indicative of input signal 116 (with no offset level).

Offset evaluation circuit 120, may be connected between output 118 and first input 112 (in the illustrated diagrams a connection is seen between offset capacitor 150 and first input 112, as illustrated). Offset evaluation circuit 120 is operable to selectively connect or couple e.g., by switch 128 a first terminal (the right terminal in the illustrated examples) of offset capacitor 150 to output 118 of amplifier 110 while a second terminal of offset capacitor 150 (the left terminal in the illustrated examples) is connected or coupled to the reference voltage source 124 via switch 126 and switch 132, thereby charging the offset capacitor 150 with charge corresponding to an offset voltage of amplifier 110.

It should be understood to a person skilled in the art that switch 128 may be implemented using any element, e.g., by one or more transistors, or in any other suitable way. According to embodiments disclosed herein, when changing connection state (between "connected" and "disconnected" and/or vice versa), switch 128 may operate in a binary fashion e.g., directly from "ON" to "OFF", for example, in a discrete fashion, with at least one intermediary state, gradually, or in any other suitable fashion.

Collected charge reduction circuitry 130, also referred herein as "Noise reduction circuitry" may include one or more electrical elements, e.g., at least one capacitor collectively denoted herein as "charge collection circuitry 136". Collected charge reduction circuitry 130 may be connected or coupled between output 118 of amplifier 110 and first input 112 (in the illustrated diagrams a connection is seen between offset capacitor 150 and first input 112). Collected charge reduction circuitry 130 is operable to selectively collecting charge which results from disconnection of offset evaluation circuit 120. The disconnection of offset evaluation circuit 120 is performed by opening switch 128. Collected charge reduction circuitry 130 is operable to collect parts, e.g., a majority of the charge, a substantial part of the charge, all the charge, or any other portion of the charge which is introduced into integrator 100 by disconnection of offset evaluation circuit 120.

Collected charge reduction circuitry 130 may include a switch 134 for selectively connecting or disconnecting the circuit from the rest of integrator 100. Switch 134 may be implemented using one or more transistors, or in any other suitable way. When changing connection state (between "connected" and "disconnected" and/or vice versa), switch 134 may operate in a binary fashion (e.g., directly from "ON" to "OFF"), in a discrete fashion with at least one intermediary state, gradually, or in any other suitable fashion.

According to some embodiments, while offset evaluation circuit 120 is connected via 128, offset capacitor 150 may be charged corresponding to an offset voltage of amplifier 110. To operate integrator 100, offset evaluation circuit 120 should be disconnected by opening switch 128, e.g., switching switch 128 to "off". Disconnection of offset evaluation circuit 120 may change the conditions on offset capacitor 150 while additional voltage, e.g., noise may be introduced leading to additional, undesirable charge accumulation on offset capacitor 150.

Collected charge reduction circuitry 130 may be used to avoid the accumulation of additional charges on offset capacitor 150, so that offset capacitor 150 may continue to hold the charge corresponding to the offset voltage of amplifier 110, not including additional charges resulted from disconnection of offset evaluation circuit 120. According to some embodiments, collected charge reduction circuitry 130, which may include one or more capacitors, is operable to selectively collecting the charge, e.g., a substantial part of the charge resulting from disconnection of the offset evaluation circuit 120, e.g., by opening switch 128. By operating offset evaluation circuit 120 and collected charge reduction circuitry 130, integration capacitor 140 may be charged with a charge indicative of a level of an input signal to the amplifier, thereby reducing an amount of charge and associated noise input to amplifier 110.

Figure 2:
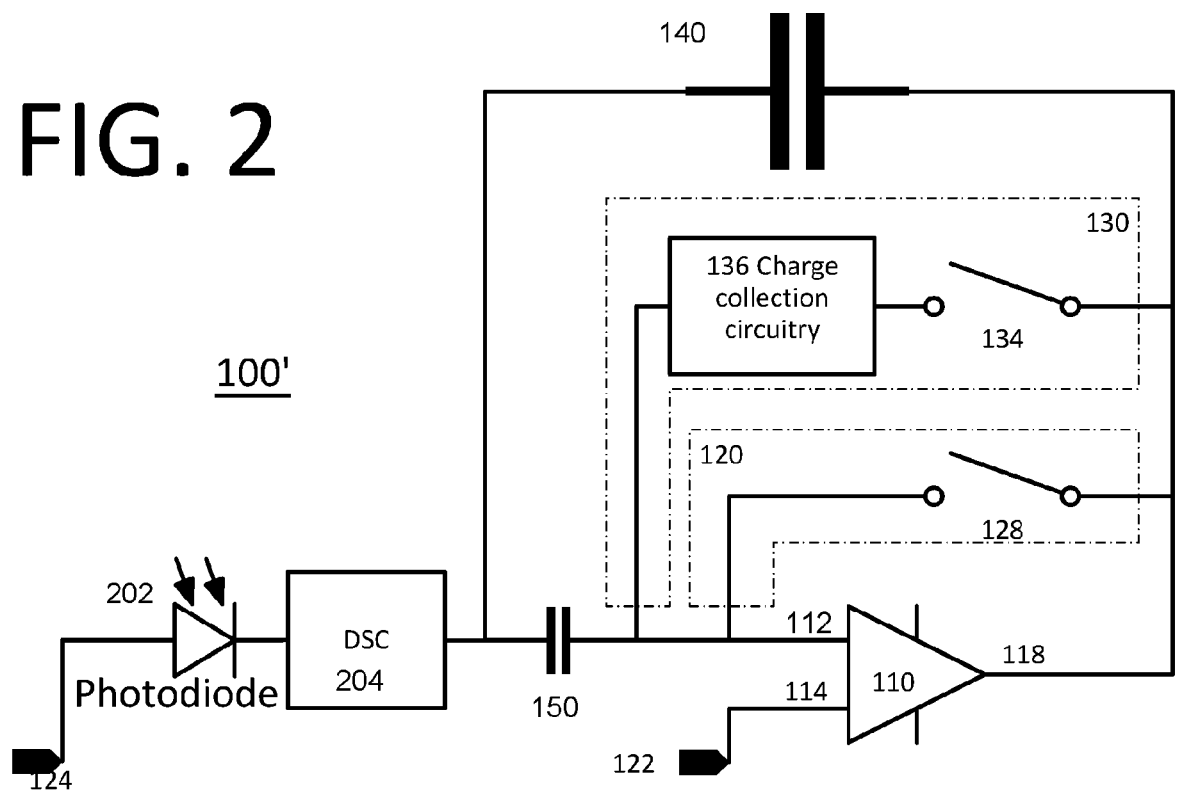
FIG. 2 is a schematic block diagram illustrating another exemplary integrator having offset reduction and collected charge reduction circuitries with an exemplary input signals disclosed herein.

FIG. 2 is a schematic block diagram illustrating another exemplary embodiment 100' of an integrator having offset reduction and collected charge reduction circuitries with an exemplary input signal, in accordance with some embodiments disclosed herein. The input signal source to integrator 100', e.g., input source 116 of FIG. 1, may be provided by various sources. Optionally, the source providing the input signal may include one or more photodiodes, operable to generate electric charge in response to light impinging on the photodiodes, as described in FIG. 2. Integrator 100' may receive its input signal from a photodiode 202 via a detection switching circuit (DSC) 204. Although the illustrated diagram shows a certain connection of photodiode 202, it should be understood to a person skilled in the art, that any type of connection may be used, e.g., photodiode 202 may be connected in an opposite direction. DSC 204 may include or may be implemented by any type and number of switches, detection elements (e.g., one or more transistors), and the like.

It is noted that with some photodiodes, the offset of amplifier 110 may introduce into integrator 100' voltages that may be on substantially the same order of magnitude as (or higher than) the detection signals. This may be related to, for example, dark current levels, I-V characteristics, noisiness, and other characteristics of the photodiode, and may also be related to the available amplifier included in integrator 100'. Therefore, the reduction of the effects of the offset may significantly improve the outputs of the detector or sensor (e.g., a photosite) of which integrator 100' is part. In some applications, the reduction of the effects of the offset may make the photosite operational at all times. The same is of course true for other types of sensors and detectors, or other sources of signals for which integrator 100' may be used.

According to some embodiments, the disclosed integrator 100', may be useful or practical when an available size for the integrator or photosite source is limited, and large capacitors are not feasible for more traditional offset cancelation solutions. For example, integrator 100' may be used in photosites whose area is restricted to 50-100 squared micrometers, to 100-200 squared micrometers, and the like.

In some embodiments, photodiode 202 and optional associated circuitry (not illustrated) may optionally be implemented with integrator 100' as a single unit, or each may be implemented as a standalone unit.

Figure 3:
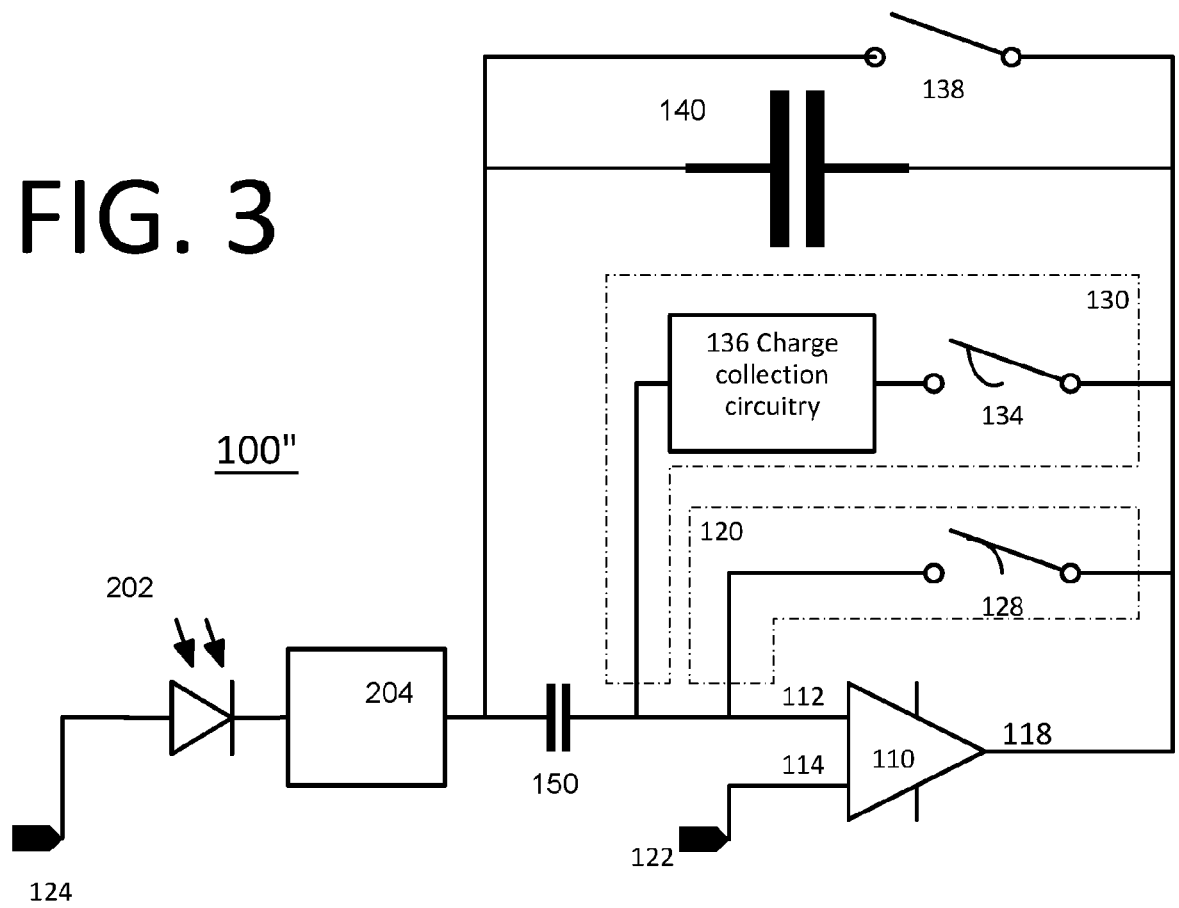
FIG. 3 is a schematic block diagram illustrating yet another exemplary integrator having offset reduction and collected charge reduction circuitries with a reset switch disclosed herein.

FIG. 3 is a schematic block diagram illustrating another exemplary embodiment 100" of an integrator having offset reduction and collected charge reduction circuitries with a reset switch, in accordance with some embodiments disclosed herein. Optionally, integrator 100" may include a reset switch 138 for selectively discharging charge collected on integration capacitor 140 (e.g., before actual measurement).

In some embodiments, reset switch 138 may optionally be used at any desired time, e.g., after disconnection of collected charge reduction circuitry 130, before operating integration process of integrator 100", or at any other time. Closing reset switch 138, e.g., switching it to "ON" position may result in discharging the integration capacitor 140 from any charge collected in it, during previous instances of detection, or for any other reason. For example, discharging of integration capacitor may be used, for example, when a photodiode 202 is characterized by relatively high levels of dark current, which may be collected in integration capacitor 140 even when the photosite is not active (e.g., not exposed to ambient light).

Figure 4:
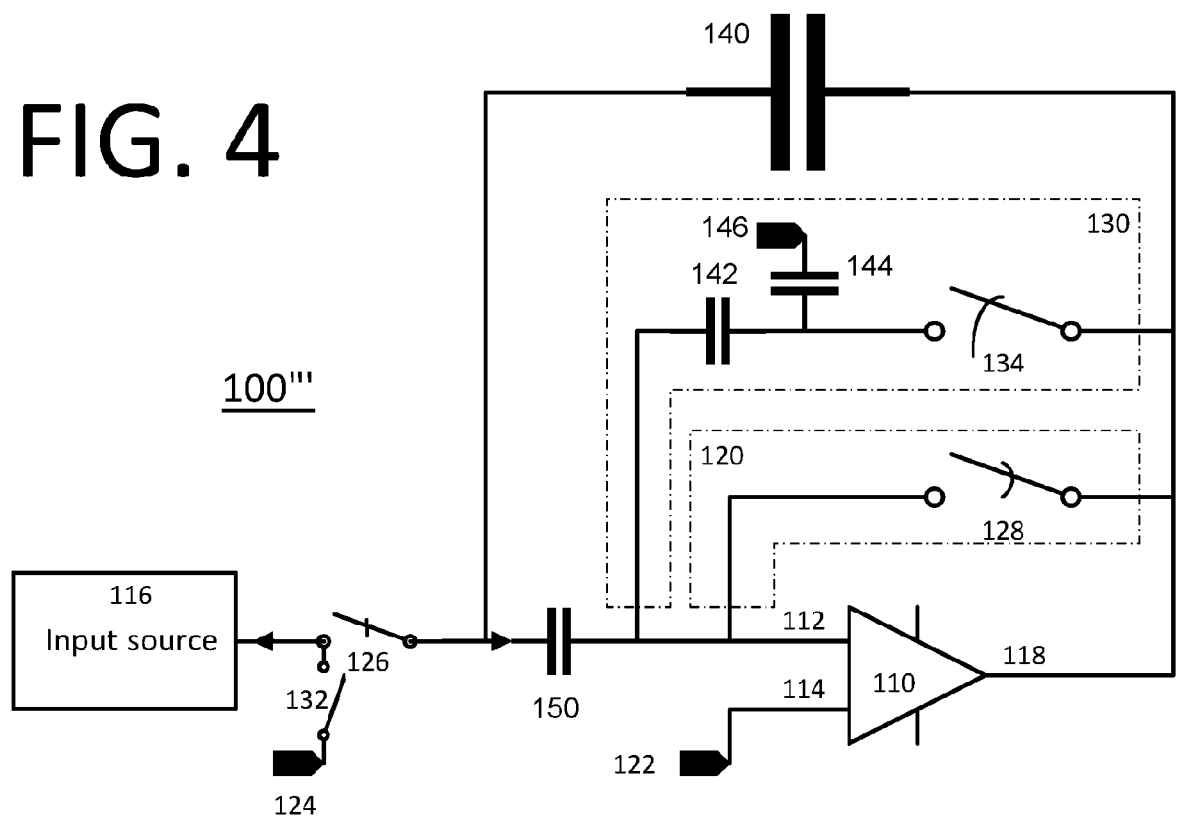
FIG. 4 is a schematic block diagram illustrating yet another exemplary integrator having offset reduction and collected charge reduction circuitries disclosed herein.

FIG. 4 is a schematic block diagram illustrating another exemplary embodiment 100''' of an integrator having offset reduction and collected charge reduction circuitries, in accordance with some embodiments disclosed herein. Charge collection circuitry 136, e.g., of FIG. 2 may operate to reduce, minimize, correct, fix or eliminate a substantial part of the noise, crosstalk, charge feedthrough and/or any additional charge that may be introduced into integrator 100 by disconnection of offset evaluation circuit 120 via opening switch 128. For example, operation of charge reduction circuitry 130 is indicated at stage 530 of FIG. 5 may follow disconnection of offset evaluation circuit 120, indicated at stage 520 of FIG. 5.

Charge collection circuitry 136 of FIG. 2 may be implemented in any suitable manner to allow operation of charge reduction circuitry 130 and may include for example, one or more capacitors connected such as to allow operation of charge reduction circuitry 130. During time after disconnection of offset evaluation circuit 120, amplifier 110 may act to correct, reduce minimize or eliminate the change introduce on input 112 by operating via switch 134 and collected charge reduction circuitry 130.

The implementation of charge reduction circuitry 130 may be selected such as to allow reduce, minimize, eliminate or correct the effect of the crosstalk or noise generated as a result of the disconnection of offset evaluation circuit 120. For example, one or more capacitors or groups of capacitors may be selected such that the relationship between their capacitance or characteristics may allow the reduction effect. For example, a high capacitance ratio of the implemented capacitors may be chosen for minimizing introduced noise or crosstalk.

In some embodiments, charge collection circuitry 136 of FIG. 2 may include, for example, one or more capacitors 142 that may be connected between switch 134 and first input 112 of amplifier 110, and one or more capacitors 144 that may be connected between switch 134 and a dedicated reference signal 146, e.g., a ground voltage, a constant voltage, or any other reference signal. During stage 530, access charge may be collected in the capacitors, and especially in capacitor 144, thereby reducing the effects of stage 520 on the charge accumulated on offset capacitor 150.

It should be understood to a person skilled in the art that the implementation described by FIG. 4 is an exemplary implementation, and that any number of capacitors or groups of capacitors as well as any other elements may be used to allow operation of charge collection circuitry 136 and charge reduction circuit 130.

Some embodiments may include additional stage of discharging charge reduction circuitry 130, e.g., discharging the one or more capacitors of charge collection circuitry 136, either during stage 550 or in any other suitable time.

It should be understood to a person skilled in the art that any of switches 128, 134, 126, 132 and 138 may be implemented using any element, e.g., by one or more transistors, or in any other suitable way. According to embodiments disclosed herein, when changing connection state (between "connected" and "disconnected" and/or vice versa), any of the abovementioned switches may operate in a binary fashion e.g., directly from "ON" to "OFF", for example, in a discrete fashion, with at least one intermediary state, gradually, or in any other suitable fashion.

Figure 5:
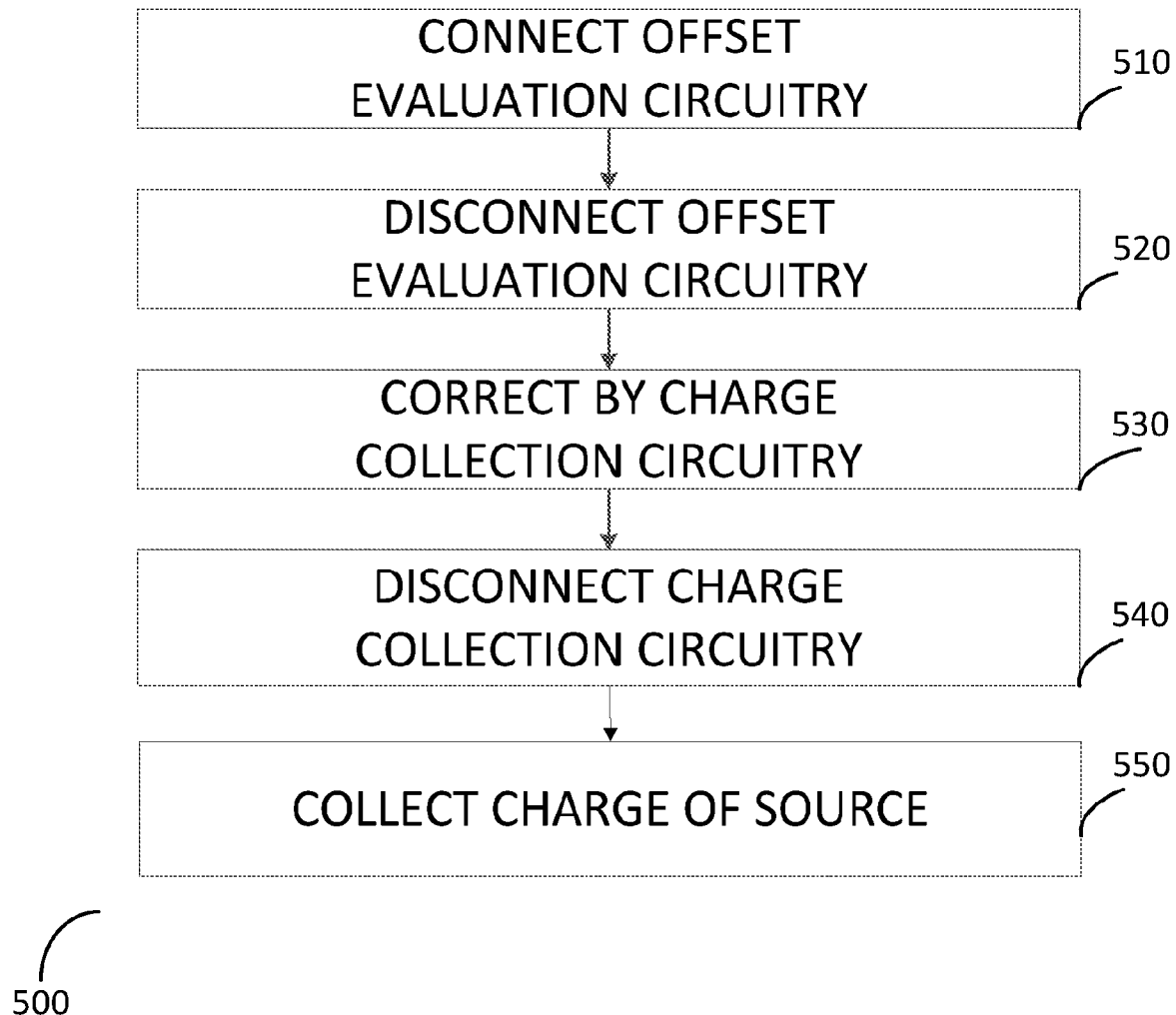
FIG. 5 is a flowchart of a method for collecting amplified signal from an input source using an electronic integrator in accordance with some embodiments disclosed herein.

Reference is made now to FIG. 5 which is a flowchart of a method for collecting amplified signal from an input source using an electronic integrator in accordance with some embodiments disclosed herein. Flowchart 500 includes a sequence that may be used for collecting amplified signal from an input source using an electronic integrator disclosed herein. The method may also include stages for reducing offset voltage and reducing collected charge. The description of the method follows with reference mainly to integrator 100 of FIG. 1, but it clearly applies in general to all integrator embodiments disclosed herein.

As indicated at stage 510, offset evaluation circuit 120 is connected, e.g., using switch 128. Collected charge reduction circuit 130 may optionally also be connected, e.g., using switch 134, for example in order to avoid introducing unnecessary noise during the transition to the following stages. The source whose signal is integrated, e.g., signal source 116 of FIG. 1, may optionally be connected to the integrator, e.g., integrator 100 of FIG. 1. However, in some embodiments, each of collected charge reduction circuit 130 and signal source 116 may optionally be disconnected. During stage 510 switch 128 may be close, namely in "ON" position. Each of switches 134, 126 and 132 may optionally be close, namely in "ON" position or may optionally be open, namely in "OFF" position.

During stage 510, the first terminal of offset capacitor 150 is subject to the reference voltage of the reference voltage source via switches 126 and 132, while the second terminal of capacitor 150 is subject to the voltage at first input 112. Therefore, the difference in voltages between the terminals of capacitor 150 is substantially equal to the offset voltage of amplifier 110, and offset capacitor 150 is charged correspondingly to the offset voltage of amplifier 110. Given sufficient charging time, the charge on offset capacitor 150 at the end of stage 510 may be substantially equal to the offset voltage of amplifier 110 at the time of charging. If, as is the case in the illustrated example of FIG. 1, offset evaluation circuit 120 short circuits output 118 and first input 112, collected charge reduction circuitry 130 has no effect, even if connected via switch 134.

As indicated at stage 520, offset evaluation circuit 120 may be disconnected by switching switch 128 to an open position. The disconnection of offset evaluation circuit 120 may introduce additional charge, e.g., noise to offset capacitor 150. For example, charge feedthrough noise, Johnson-Nyquist noise, injection offset, crosstalk and the like. In some implementations and operational conditions, the magnitude of the introduced charge or noise during stage 520 may be of the same order of magnitude as the collected offset voltage level on capacitor 150, or even higher. Embodiments disclosed herein may operate to reduce or eliminate a substantial part of the noise or additional charge which is introduced by disconnection of offset evaluation circuit 120 as further described in stage 530.

Stage 530 may follow disconnection of offset evaluation circuit 120, indicated at stage 520 and may include a process of correcting, minimizing or eliminating the noise or additional charges which resulted from disconnection of offset evaluation circuit 120. During stage 530, collected charge reduction circuit 130 is connected, while offset evaluation circuit 120 is disconnected. With time, amplifier 110 starts to reduce the effect of the crosstalk or noise generated as a result of the disconnection of offset evaluation circuit 120 (indicated at stage 520). During time, amplifier may act to correct, reduce minimize or eliminate the change introduce on input 112 by operating via switch 134 and collected charge reduction circuit 130. The amount of remaining noise may depend on the gain of amplifier 110, e.g., divided by the magnitude of gain. It should be noted that the source (whose signal is integrated) may be optionally connected or disconnected during stage 530.

Stage 540 may follow stage 530 and may include disconnection of collected charge reduction circuitry 130 to allow operation of integrator 100. Stage 540 may also introduce noises or additional crosstalk to integrator 100 which may be collected by offset capacitor 150, but those noises are of a significantly lower scale than the ones introduced in stage 520 e.g., by an order of magnitude, and therefore may not interrupt to the operation of integrator 100.

Stage 550 may include collecting charge of the signal from the input source by capacitor 140. Stage 550 may be executed after the conclusion of stage 540 and may include collecting charge indicative of a level of the input signal by integration capacitor 140 thereby reducing an amount of charge and associated noise input to the amplifier. For example, in an implementation of a photodiode as a source signal, photodiode detection charge may be collected by capacitor 140, possibly including dark noise or other types of noise. During stage 550, switch 126 is closed namely in "ON" position and switch 132 is open, namely in "OFF" position thus reference source 124 is disconnected. Both offset evaluation circuit 120 and noise reduction circuitry 130 are disconnected at this stage.

Stage 560 may include discharging integration capacitor 140 from any charge collected in it, e.g., as a result of the previous stages of the method, during previous instances of detection, or for any other reason. The discharging integration capacitor 140 may be performed by reset switch 138 as described and illustrated in FIG. 3. In some embodiments, stage 560 may optionally be performed before stage 550 or at any other time, e.g., after the conclusion of stage 540.

All the switching operations, transition between stages, and so on, are possibly controlled by one or more controller of integrator 100 and/or by one or more external controller (not shown).

Some embodiments may include a method for operating an integrator. The method may include connecting an offset evaluation circuit to charge an offset capacitor with a first charge corresponding to an offset voltage of an amplifier, connecting a collected charge reduction circuitry between an output of the amplifier and a first input of the amplifier and disconnecting the offset evaluation circuit. After disconnecting the offset evaluation circuit, collecting a second charge resulting from disconnection of the offset evaluation circuit, by the collected charge reduction circuitry and collecting a third charge indicative of a level of an input signal by an integration capacitor, thereby reducing an amount of charge and associated noise input to the amplifier.

Connecting an offset evaluation circuit may include connecting the offset evaluation circuit between the output of the amplifier and the first input of the amplifier thereby coupling a first terminal of the offset capacitor to the output of the amplifier while a second terminal of the offset capacitor is coupled to the reference voltage source. The collected charge reduction circuitry may be connected to the integrator via a switch and may include an integration capacitor connected between the switch and the first input of the amplifier and a offset capacitor connected between the switch and a dedicated reference signal.

Referring to implementation of the method for an integrator which is incorporated into a photosite of a focal plane array (e.g., any one of the ones developed by TriEye LTD. of Tel Aviv, Israel, or any of the one disclosed in previous patent applications assigned to TriEye LTD. of Tel Aviv, Israel such as the aforementioned PCT/IB2020/060011), it is noted that the method may be executed for the detection of a signal for determining a pixel color or detection level (e.g., one in a frame grab window in which a frame of the entire FOV of the focal plane array is detected). In other implementations, the determining of offset voltage level by integrator 100 may be repeated several times during a single measurement (e.g., including several resets and/or discharges on one or more components of integrator 100).

As used herein, the phrases "for example", "such as" and variants thereof describe non-limiting embodiments of the presently disclosed subject matter.

Various embodiments have been presented. Each of these embodiments may of course include features from other embodiments presented, and embodiments not specifically described may include various features described herein.

It is appreciated that certain features of the presently disclosed subject matter, which are, for clarity, described in the context of separate embodiments, may also be provided in combination in a single embodiment. Conversely, various features of the presently disclosed subject matter, which are, for brevity, described in the context of a single embodiment, may also be provided separately or in any suitable subcombination.

In embodiments of the presently disclosed subject matter one or more stages or steps illustrated in the figures may be executed in a different order and/or one or more groups of stages may be executed simultaneously and vice versa. The figures illustrate a general schematic of the system architecture in accordance with an embodiment of the presently disclosed subject matter. Each module in the figures can be made up of any combination of software, hardware and/or firmware that performs the functions as defined and explained herein. The modules in the figures may be centralized in one location or dispersed over more than one location.

Any reference in the specification to a method should be applied mutatis mutandis to a system capable of executing the method and should be applied mutatis mutandis to a non-transitory computer readable medium that stores instructions that once executed by a computer result in the execution of the method.

Unless otherwise defined, all technical and scientific terms used herein have the same meaning as commonly understood by one of ordinary skill in the art to which this disclosure belongs. The materials, methods, and examples provided herein are illustrative only and not intended to be limiting.

Implementation of the method and system of the present disclosure involves performing or completing certain selected tasks or steps manually, automatically, or a combination thereof. Moreover, of actual instrumentation and equipment of preferred embodiments of the method and system of the present disclosure, several selected steps could be implemented by hardware or by software on any operating system of any firmware or a combination thereof. For example, as hardware, selected steps of the disclosure could be implemented as a chip or a circuit. As software, selected steps of the disclosure could be implemented as a plurality of software instructions being executed by a computer using any suitable operating system. In any case, selected steps of the method and system of the disclosure could be described as being performed by a data processor, such as a computing platform for executing a plurality of instructions.

While certain features of the disclosure have been illustrated and described herein, many modifications, substitutions, changes, and equivalents may occur to those skilled in the art. It is, therefore, to be understood that the appended claims are intended to cover all such modifications and changes as fall within the true spirit of the disclosure.

All references mentioned in this specification are herein incorporated in their entirety by reference into the specification, to the same extent as if each individual reference was specifically and individually indicated to be incorporated herein by reference. In addition, citation or identification of any reference in this application shall not be construed as an admission that such reference is available as prior art to the present application.

What is claimed is:

1. An integrator, comprising:
   an amplifier operable to amplify an input signal;
   an integration capacitor for collecting charge indicative of a level of the input signal;
   an offset capacitor;
   an offset evaluation circuit operable to charge the offset capacitor with charge corresponding to an offset voltage of the amplifier; and
   a collected charge reduction circuitry operable to collect charge resulting from disconnection of the offset evaluation circuit,
   wherein the input signal is coupled to a first input of the amplifier, wherein a reference signal is provided to a second input of the amplifier, and wherein the integration capacitor is coupled between an output of the amplifier and via the offset capacitor to the first input of the amplifier.

2. The integrator of claim 1, wherein the input signal is provided by a source comprising at least one photodiode, operable to generate electric charge in response to light impinging on the at least one photodiode.

3. The integrator of claim 1, wherein the offset capacitor is coupled between the first input of the amplifier and a reference voltage source.

4. The integrator of claim 1, wherein the offset evaluation circuit is coupled between the output of the amplifier and the first input of the amplifier and is operable to selectively couple a first terminal of the offset capacitor to the output of the amplifier while a second terminal of the offset capacitor is coupled to the reference voltage source.

5. The integrator of claim 1, wherein the collected charge reduction circuitry is coupled between the output of the amplifier and the first input of the amplifier.

6. The integrator of claim 1, wherein the collected charge reduction circuitry comprises at least one capacitor.

7. The integrator of claim 1, wherein the collected charge reduction circuitry is connected to the integrator via a switch.

8. The integrator of claim 7, wherein the integration capacitor is connected between the switch and the first input of the amplifier and wherein the offset capacitor is connected between the switch and a dedicated reference signal.

9. A method, comprising:
   connecting an offset evaluation circuit to charge an offset capacitor with a first charge corresponding to an offset voltage of an amplifier;
   connecting a collected charge reduction circuitry between an output of the amplifier and a first input of the amplifier;
   disconnecting the offset evaluation circuit;
   by the collected charge reduction circuitry, collecting a second charge resulting from disconnection of the offset evaluation circuit; and
   by an integration capacitor coupled between the output of the amplifier and via the offset capacitor to the first input of the amplifier, collecting a third charge indicative of a level of an input signal input to the amplifier, thereby reducing an amount of charge and associated noise input to the amplifier.

10. The method of claim 9, wherein the connecting an offset evaluation circuit comprises connecting the offset evaluation circuit between the output of the amplifier and the first input of the amplifier, thereby coupling a first terminal of the offset capacitor to the output of the amplifier while a second terminal of the offset capacitor is coupled to a reference voltage source.

11. The method of claim 9, wherein the input signal is coupled to the first input of the amplifier and wherein a reference signal is provided to a second input of the amplifier.

12. The method of claim 9, wherein the offset capacitor is coupled between the first input of the amplifier and a reference voltage source.

13. The method of claim 9, wherein the collected charge reduction circuitry comprises at least one capacitor.

14. The method of claim 9, wherein the collected charge reduction circuitry is connected to the integrator via a switch.

15. The method of claim 14, wherein the integration capacitor is connected between the switch and the first input of the amplifier and wherein the offset capacitor is connected between the switch and a dedicated reference signal.

16. The method of claim 9, wherein the input signal is provided by a source comprising at least one photodiode, operable to generate electric charge in response to light impinging on the at least one photodiode.

17. An integrator, comprising:
   an amplifier operable to amplify an input signal;
   an integration capacitor for collecting charge indicative of a level of the input signal, wherein the input signal is coupled to a first input of the amplifier, and wherein a reference signal is provided to a second input of the amplifier;
   an offset capacitor;
   an offset evaluation circuit operable to charge the offset capacitor with charge corresponding to an offset voltage of the amplifier, wherein the offset evaluation circuit is coupled between the output of the amplifier and the first input of the amplifier and is operable to selectively couple a first terminal of the offset capacitor to the output of the amplifier while a second terminal of the offset capacitor is coupled to a reference voltage source; and
   a collected charge reduction circuitry operable to collect charge resulting from disconnection of the offset evaluation circuit.

18. The integrator of claim 17, wherein the input signal is provided by a source comprising at least one photodiode, operable to generate electric charge in response to light impinging on the at least one photodiode.

19. The integrator of claim 17, wherein the collected charge reduction circuitry is connected to the integrator via a switch.

* * * * *